United States Patent [19]
Boyd

[11] Patent Number: 5,226,232
[45] Date of Patent: Jul. 13, 1993

[54] METHOD FOR FORMING A CONDUCTIVE PATTERN ON AN INTEGRATED CIRCUIT

[75] Inventor: Melissa D. Boyd, Corvallis, Oreg.

[73] Assignee: Hewlett-Packard Company, Palo Alto, Calif.

[21] Appl. No.: 743,462

[22] Filed: Aug. 9, 1991

Related U.S. Application Data

[62] Division of Ser. No. 525,935, May 18, 1990, abandoned.

[51] Int. Cl.$^5$ .............................................. H05K 3/02
[52] U.S. Cl. ................................... 29/846; 156/656; 156/659.1; 174/261; 205/125; 205/126
[58] Field of Search ................... 29/846, 847; 174/253, 174/261; 439/43, 44; 156/659.1, 661.1, 656; 205/125, 126

[56] References Cited

U.S. PATENT DOCUMENTS

| | | | |
|---|---|---|---|
| 3,169,892 | 2/1965 | Lemelson | 174/253 X |
| 3,957,552 | 5/1976 | Ahn et al. | 156/656 X |
| 4,394,678 | 7/1983 | Winchell, II et al. | |
| 4,436,766 | 3/1984 | Williams | 174/261 X |
| 4,601,915 | 7/1986 | Allen et al. | 174/261 X |
| 4,652,336 | 3/1987 | Andrascek et al. | 156/659.1 X |
| 4,861,425 | 8/1989 | Greer et al. | 156/656 X |
| 4,927,505 | 5/1990 | Sharma et al. | 204/34.5 |
| 5,118,386 | 6/1992 | Kataoka et al. | 156/659.1 X |

FOREIGN PATENT DOCUMENTS

| | | | |
|---|---|---|---|
| 47-5573 | 2/1972 | Japan | 29/846 |
| 1567808 | 5/1980 | United Kingdom | |
| 2180991 | 4/1987 | United Kingdom | |

*Primary Examiner*—Carl J. Arbes

[57] ABSTRACT

A method for processing an integrated circuit of the type having conductive die bond pads thereon. The fabricated IC is coated with a layer of photoresist. The photoresist is exposed to create a pattern which includes windows over the pads and a connection between at least two of the pads. The exposed photoresist is dissolved and the exposed portions are plated with gold to a depth sufficient for creating a bump over each die bond pad suitable for bonding a conductive lead thereto. The remaining photoresist is dissolved thus leaving a plurality of bumps for attaching conductive leads thereto and an electrical connection between at least two of the bumps.

20 Claims, 3 Drawing Sheets

5,226,232

METHOD FOR FORMING A CONDUCTIVE PATTERN ON AN INTEGRATED CIRCUIT

CROSS REFERENCE TO RELATED APPLICATION

This is a divisional of copending application Ser. No. 07/525,935 filed on May 18, 1990, now abandoned.

BACKGROUND OF THE INVENTION

1. Field of the Invention

The present invention relates to methods and apparatus for fabricating integrated circuits and more particularly to such circuits upon which conductive bumps are formed for providing a contact point to which a lead can be bonded.

2. Description of the Related Art

One means for connecting conductive leads to an integrated circuit die is known as tape-automated bonding (TAB). In the TAB process, an elongate continuous film includes a plurality of lead frames formed sequentially thereon. During the manufacturing process, an integrated circuit die is mounted on the inner ends of the leads in a frame. The outer ends of the leads may then be used to connect the integrated circuit with other components.

When processing a wafer which includes ICs that are to be used in the TAB process, special steps are taken to create conductive bumps to which the inner leads of the TAB frame can be heat bonded. Completed wafers are first sputter etched and then deposited with a barrier metal film of titanium/tungsten. The titanium/tungsten layer provides a suitable surface for a thin (approximately 1 or 2 microns) layer of gold which is plated thereover. Photoresist is spun onto the wafer in a layer 30 microns thick and exposed and developed to leave an opening over each die bond pad. The exposed portions of the wafer are then electroplated with gold by using an electrode to contact the thin film layer. Thereafter the photoresist is stripped and the gold and titanium/tungsten thin films are etched away leaving the wafer with 1 mil high gold bumps over each bond pad.

Each bump provides a mechanical stand-off from the surface of the IC thus preventing lead shorting to the IC and/or physical damage to the IC during the process of bonding the inner leads on the TAB frame to the gold bumps.

SUMMARY OF THE INVENTION

The present invention comprises a silicon substrate within which circuit components are formed. A plurality of conductive pads are mounted on the surface of the substrate and are in electrical communication with selected circuit components. The pads are exposed through windows formed in a passivation layer formed over the circuit. At least some of the pads include a plurality of conductive bumps formed thereon for providing a contact point to which a conductive lead can be bonded. A lithographically defined conductive pattern is formed on the passivation layer for connecting selected ones of the pads.

A method for making the integrated circuit of the invention is also provided.

It is a general object of the present invention to provide a method and apparatus for forming a conductive pattern on an integrated circuit.

It is a more specific object of the present invention to provide such a method and apparatus for making electrical connections between different parts of the circuit.

It is another more specific object of the present invention to provide such a method and apparatus which produces a substantially planar conductive film usable as a power or ground distribution plane or as mounting pad for a decoupling capacitor.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENTS

Figure 1:
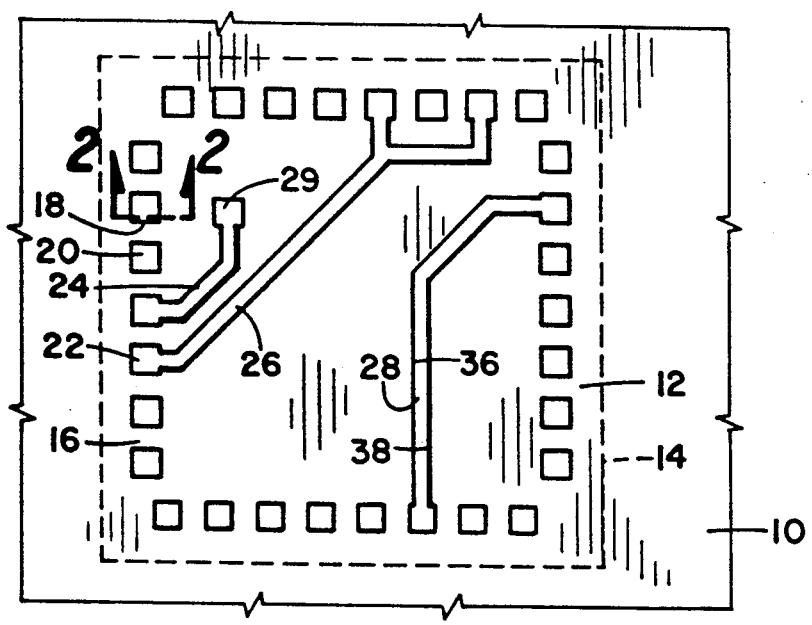
FIG. 1 is a plan view of a portion of a wafer having an integrated circuit formed thereon.

Turning now to FIG. 1, a portion of a silicon wafer 10 includes an integrated circuit (IC) 12 formed within dashed line 14. A plurality of other ICs (not shown) are also formed on wafer 10 and are substantially identical to IC 12. Wafer 10 is covered with a layer of conventional photoresist 16 except for a plurality of windows, like windows 18, 20, 22, formed about the perimeter of the IC and channels 24, 26, 28 which interconnect selected windows as shown. An additional window 29 is formed on an interior portion of IC 12. The pattern of windows and channels are referred to herein as a lithographically defined pattern. The channels and windows are formed by spinning a layer of photoresist approximately 30 microns thick onto the wafer using a known process. Thereafter, a mask containing the pattern of windows and channels shown in FIG. 1 is used to expose the photoresist on each IC after which the exposed portion of the photoresist is dissolved thereby creating the pattern of windows and channels shown in FIG. 1.

Figure 2:
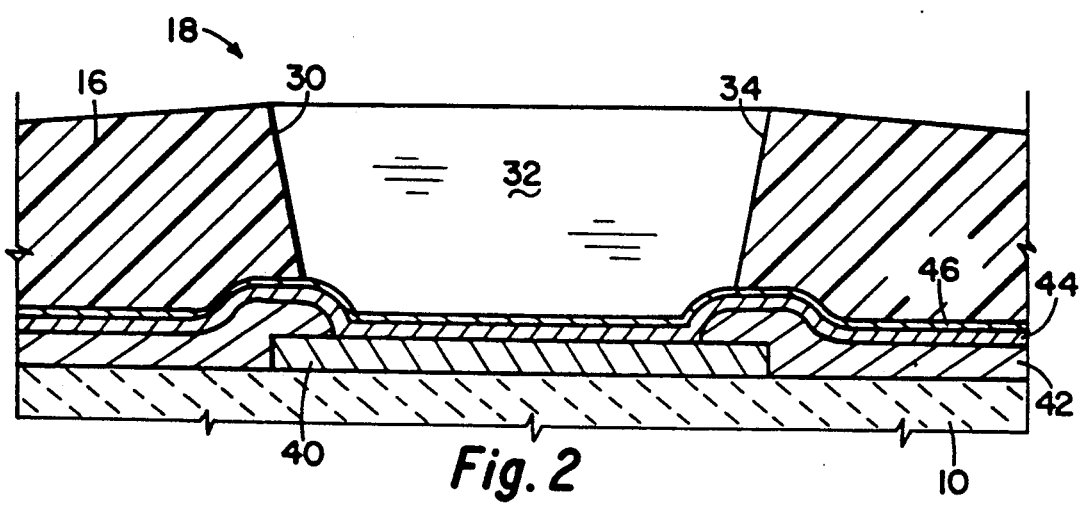
FIG. 2 is a view taken along line 2—2 in FIG. 1.

Each window includes four walls, three of which are walls 30, 32, 34 in FIG. 2, which extend from the upper surface of photoresist 16 to the lower surface thereof. Similarly, in FIG. 1, each of channels 24, 26, 28 is defined by a pair of opposing walls, like walls 36, 38 in channel 28, which extend from the top layer of photoresist 16 to the bottom thereof.

Prior to applying photoresist 16 and defining the windows and channels as described above, patterned layers of conductive and insulative materials are formed on the surface of the wafer beginning with a plurality of conductive die bond pads, like pad 40. Each of the windows, like windows 18, 20, 22, frames a die bond pad, like window 18 frames pad 40, which is electrically connected to a portion of IC 12 internally of wafer 10. As will be seen hereinafter, bumps are plated onto the die bond pads to provide a connection point for a conductive lead. Window 29 also frames a conductive pad which is connected to selected regions in the IC; however, the pad under window 29 is not one to which a lead is electrically connected.

After the conductive pads, like pad 40, are formed, a nitride passivation layer 42 is formed over wafer 10 except that a substantial central portion of each pad, like pad 40, remains exposed. Thereafter a barrier metal film 44 of titanium/tungsten is deposited on the entire wafer and a plating "seed" layer 46 of gold is deposited over layer 44. Layers 44, 46 are referred to herein as a thin metal film. The conductive pads, like pad 40, and their associated connections (not shown) with the IC formed in wafer 10 are constructed using a known technique. Similarly, forming of layers 42, 44, 46 as described is accomplished using a conventional process.

Figure 3:
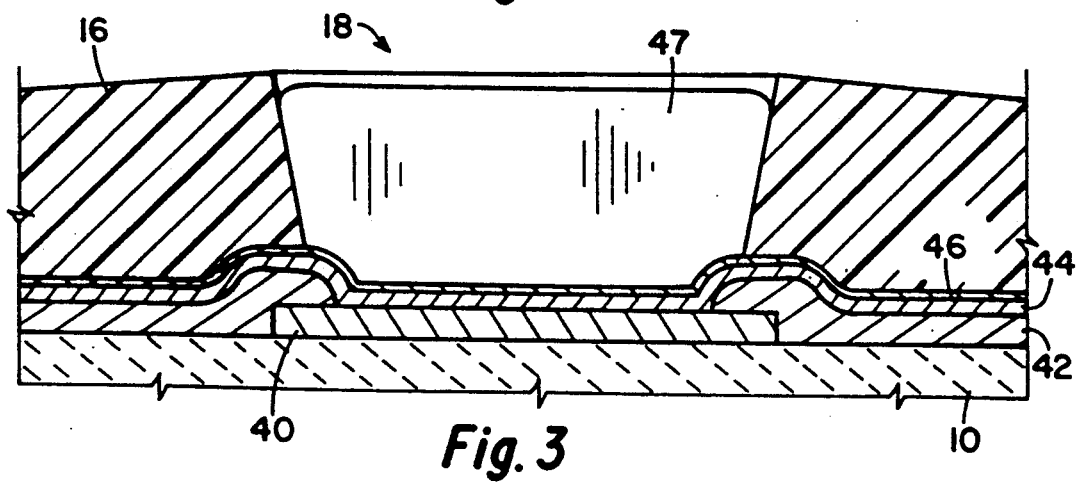
FIGS. 3 and 4 are views similar to FIG. 2 after additional wafer processing.

After the photoresist on wafer 10 is patterned with the windows and channels as shown in FIG. 1, exposed gold layer 46 in each window and channel is plated with gold using a prior art plating process in which an electrode is applied to layer 46. In FIG. 3, the exposed portions of gold layer 46 are plated until a bump 47 having a height of approximately 1 mil is formed in each window, like windows 18, 20, 22, 29, and a conductive gold trace, also having a height of approximately 1 mil, is formed in each channel, like channels 24-28. Thereafter the remaining photoresist 16 is dissolved.

Figure 4:
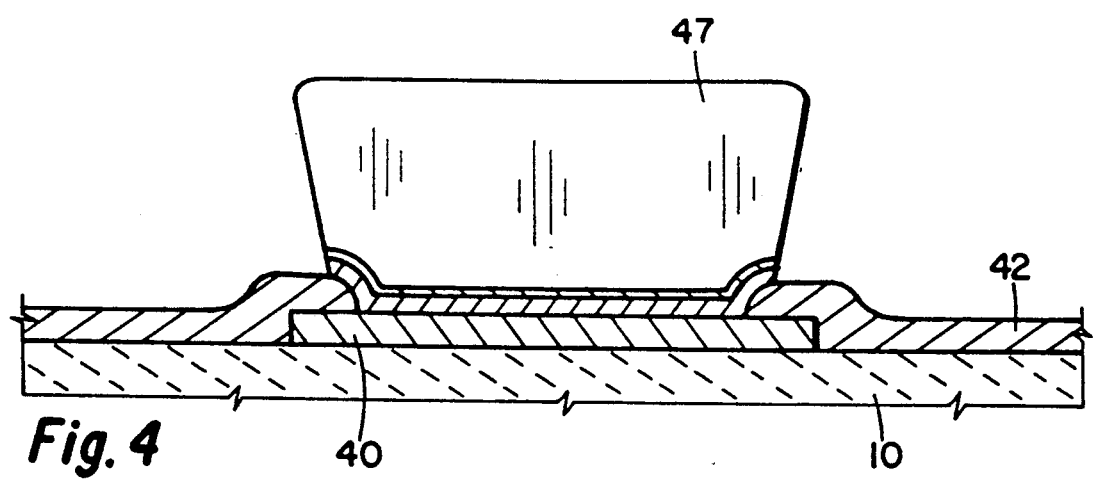

Next, the exposed portion of layers 44, 46, i.e., those portions which are not beneath the gold plated into the windows and channels, is etched away. This leaves only the gold plated into the windows and channels, as well as passivation layer 42, exposed on the surface of the wafer. Techniques for dissolving the photoresist and etching away layers 44, 46 are known. The resulting structure with reference to bump 47 is shown in FIG. 4. Next, each of the ICs on the wafer are cut into individual ICs in a known manner and leads or wires (not shown) are attached to each of the bumps, like bump 47, on each IC to provide a means for connecting the IC to other components.

Thus, rerouting of IC connection from one bump to another is achieved by the gold deposited in each of the channels, like channels 24, 26, 28. This is obtained without adding additional connections internally of the IC and without forming such connections on the surface of wafer 10 with the bonding pads, like pad 40. Additionally, bump 29 and the trace formed in channel 24 provide a connection between the bump formed on the end of channel 24 opposite bump 29 and the internal portions of the IC to which the pad beneath bump 29 is connected.

Figure 5:
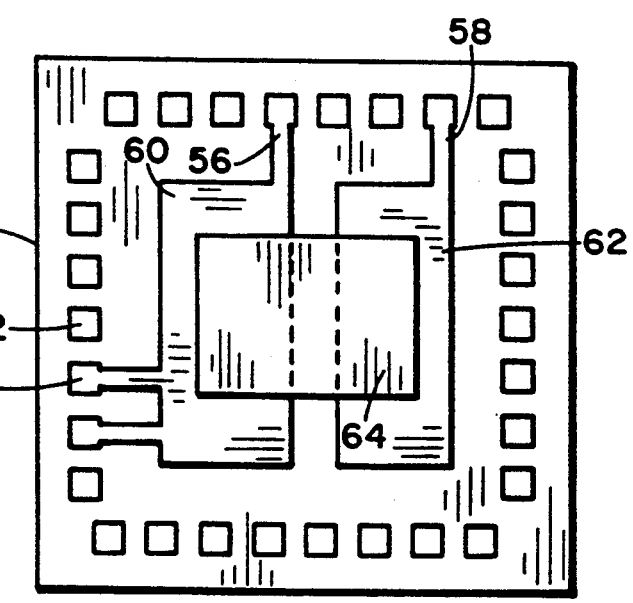
FIGS. 5 and 6 are plan views of different integrated circuits constructed in accordance with the present invention.

In FIG. 5, another embodiment of the invention is illustrated including an IC 50 which is cut from a wafer (not shown) upon which it was fabricated. IC 50 includes a plurality of bumps, like bumps 52, 54, which are formed on the IC in the same manner as described in connection with bump 47. Also included are traces, like traces 56, 58, which connect selected bumps to a pair of substantially planar metal pads 60, 62. A decoupling capacitor 64 is mounted on pads 60, 62 and is electrically connected thereto. Bumps 52, 54; the traces, like traces 56, 58; and pads 60, 62 are formed on IC 50 in the same fashion as the bumps and traces of IC 12 as previously described. Pads 60, 62 thus provide mounting pads for capacitor 64 thereby increasing its decoupling capabilities by positioning it as close as possible to IC 50.

Figure 6:
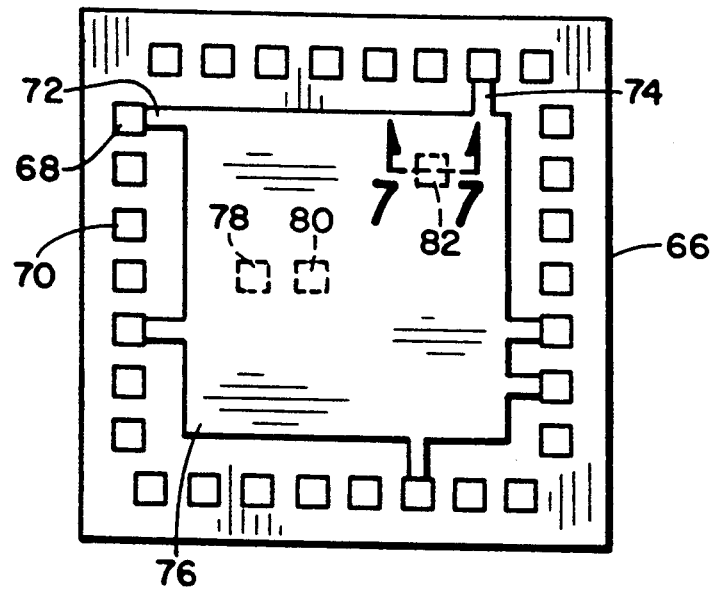

Turning now to FIG. 6, illustrated therein is an IC 66 comprising a third embodiment of the present invention. The IC was formed on and cut from a wafer as described in connection with the embodiment of FIG. Included therein are a plurality of bumps, like bumps 68, 70; a plurality of traces, like traces 72, 74; and a substantially planar gold film 76 which is connected to selected bumps via traces, like trace 72 connects film 76 to bump 68. Conductive pads 78, 80, 82 are formed beneath film 76 and are connected to internal portions of IC 66.

Figure 7:
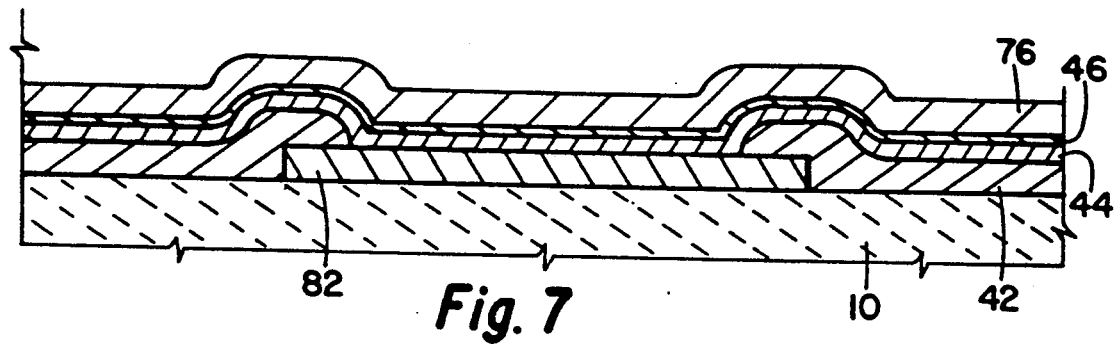
FIG. 7 is a view taken along line 7—7 in FIG. 1.

In FIG. 7 structures similar to that as described in connection with the embodiment of FIG. 2 retain the corresponding numeral. As can be seen in FIG. 7, layer 76 is substantially thinner than the height of the bumps, like bump 47, described in the embodiment of FIG. 4. It should be appreciated that the bumps, like bumps 68, 70, in the embodiment of FIG. 6 are substantially the same height as bump 47 in FIG. 4.

In the embodiment of FIGS. 6 and 7, film 76 and the traces, like traces 72, 74, provide electrical connection of selected bumps to internal portions of IC 66 via pads 78, 80, 82. In the present embodiment of the invention, film 76 provides a power distribution plane. Such a circuit could be designed which incorporated a similar film as a ground distribution plane.

The wafer upon which IC 66 was formed is processed slightly differently than described in connection with previous embodiments of the invention. All of the pads, like pads 82, and layers 42, 44, 46 are formed using the same prior art processes referred to in connection with the previously described embodiments. Thereafter, a layer of photoresist is spun over the entire wafer. Next, a mask (not shown) is used to expose windows only over the die bond pads, like pads 68, 70, which are formed sequentially about the perimeter of IC 66. Windows are not provided over pads 78, 80, 82.

The photoresist is then exposed and processed to remove photoresist over each of the perimetral die bond pads. The previously described plating process is used to form a gold bump, like bump 68, having a height of approximately 1 mil, like bump 47 in FIG. 4. Thereafter a second layer of photoresist is deposited on the IC. A mask having the pattern of film 76 and each of the traces, like traces 72, 74, is then used to expose the photoresist.

The exposed photoresist is washed away thus leaving gold layer 46 exposed in a pattern like that shown for film 76 and the traces, like traces 72, 74, in FIG. 6. Gold film 76 is thereafter plated onto layer 46 to the height shown in FIG. 7 which is substantially less than the height of bumps 68, 70. The process for forming the lithographically defined conductive pattern in FIG. 6 and 7 thus uses substantially less gold than in the previously described embodiments.

It is to be appreciated that this technique could be used to form the pattern made by traces 24, 26, 28 and bump 29 in FIG. 1 as well as pads 60, 62 and the traces, like traces 56, 58, in FIG. 5 thus reducing the amount of gold required for creating the conductive pattern. The embodiment of FIGS. 6 and 7 thus provides a ground or power distribution plane and creates a lithographically defined conductive pattern utilizing less gold than the previously described embodiments. Also provided are connections between the lithographically defined pattern and internal portions of the IC via pads 78, 80, 82.

In another process which implements the present invention, layers 44, 46 are etched to define the lithographically conductive pattern. In this process, after the bumps, like bump 47 in FIG. 3, are formed and before photoresist 16 is washed away, a mask comprising a negative of film 76 is used to expose the photoresist.

Thereafter, the undeveloped photoresist is washed away and the exposed layers 44, 46 are etched thus leaving film 76 in the pattern shown in FIG. 6. This implementation of the invention requires only one plating process, that in which the bumps are formed on the die.

Having illustrated and described the principles of my invention in a preferred embodiment thereof, it should be readily apparent to those skilled in the art that the invention can be modified in arrangement and detail without departing from such principles.

I claim all modifications coming within the spirit and scope of the accompanying claims:

1. A method for processing an integrated circuit of the type having conductive pads thereon which provide contact to different parts of the circuit, said method comprising the steps of:
   coating the circuit with a layer of photoresist;
   creating a lithographically defined pattern in the photoresist which includes an opening over a plurality of the pads and a connection between at least two of the pads;
   plating the exposed circuit portions with a conductive metal to a depth sufficient for creating a bump over each pad suitable for bonding a conductive lead thereto thereby defining a circuit connection between at least two of the pads;
   dissolving the remaining photoresist; and
   bonding different leads to the bumps formed over the pads 2. The method of claim wherein the integrated circuit further includes a thin metal film coating the surface thereof and wherein said method further includes the step of etching the metal film from the unplated portions of the integrated circuit.

3. A method for processing an integrated circuit of the type having conductive pads thereon, said method comprising the steps of:
   coating the circuit with a layer of photoresist;
   creating a lithographically defined pattern in the photoresist which includes an opening over a plurality of the pads and a connection between at least two of the pads;
   plating the exposed circuit portions with a conductive metal to a depth sufficient for creating a bump over each pad suitable for bonding a conductive lead thereto thereby creating a substantially planar metal plate; and
   dissolving the remaining photoresist.

4. The method of claim 3 wherein said method further includes the step of mounting a decoupling capacitor 64 on said plate.

5. A method for processing an integrated circuit of the type having conductive die bond pads disposed about the outer periphery of said integrated circuit and a conductive pad formed on said circuit inwardly of said peripheral pads and being in electrical communication with said circuit, said method comprising the steps of:
   coating the circuit with a layer of photoresist;
   creating a lithographically defined pattern in the photoresist which includes an opening over a plurality of the pads and a connection between at least two of the pads exposing the photoresist to create a pattern which includes an opening over a plurality of the pads and a connection between said conductive pad and another pad;
   plating the exposed circuit portions with a conductive metal to a depth sufficient for creating a bump over each pad suitable for bonding a conductive lead thereto and
   dissolving the remaining photoresist.

6. A method for processing an integrated circuit 12 of the type having die bond pads 40 thereon, said method comprising the steps of:
   coating the circuit with a first layer of photoresist 16;
   creating a first lithographically defined pattern in the photoresist 16 which includes an opening 18 over plurality of the pads;
   plating the exposed circuit portions with a conductive metal to a depth sufficient for creating a bump 47 over each pad suitable for bonding a conductive lead thereto;
   dissolving the remaining photoresist 16;
   coating the circuit with a second layer of photoresist;
   creating a second lithographically defined pattern in the second layer of photoresist which includes a connection between at least two of the pads; and
   plating the exposed circuit portions with a conductive metal 76 to a depth substantially thinner than the depth of the first plating.

7. The method of claim 6 wherein the integrated circuit 12 further includes a thin metal film 44, 46 coating the surface thereof and wherein said method further includes the step of etching the metal film from the unplated portions of the integrated circuit.

8. The method of claim 6 wherein the steps of creating a second lithographically defined pattern in the second layer of photoresist pattern and plating the exposed circuit portions with a conductive metal 76 to a depth substantially thinner than the depth of the first plating comprise the step of creating a substantially planar metal plate 60.

9. The method of claim 8 wherein said method further includes the step of mounting a decoupling capacitor 64 on said plate.

10. The method of claim 6 wherein:
   said die bond pads 40 are disposed about the outer periphery of said integrated circuit 12;
   said integrated circuit 12 further includes a conductive pad 82 formed on said circuit inwardly of said die bond pads and being in electrical communication with said circuit; and
   the step of creating a second lithographically defined pattern in the second layer of photoresist comprises the step of exposing the second layer of photoresist to create a pattern which includes a connection between said conductive pad 82 and another pad 68.

11. A method for processing an integrated circuit type having a plurality of die bond pads on the surface thereof which provide contact to different parts of the circuit, said method comprising the steps of:
   coating the surface of the integrated circuit with a thin metal layer;
   coating the circuit with a first layer of photoresist;
   creating a first lithographically defined pattern in the photoresist which includes an opening over a plurality of the pads;
   plating the exposed circuit portions with a conductive metal to a depth sufficient for creating a bump over each pad suitable for bonding a conductive lead thereto;
   dissolving the photoresist remaining in said first layer;

coating the circuit with a second layer of photoresist after the step of dissolving the photoresist remaining in said first layer;

creating a lithographically defined pattern in the second layer of photoresist which includes a connection between at least two of the bumps; and plating the exposed circuit portions with a conductive metal to a thickness substantially thinner than the height of the bumps thereby defining a circuit connection.

12. The method of claim 11 wherein said method further includes the step of etching the thin metal film 44, 46 from the unplated portions of the integrated circuit.

13. The method of claim 11 wherein the steps of creating a lithographically defined pattern in the photoresist which includes a connection between at least two of the bumps and plating the exposed circuit portions with a conductive metal to a thickness substantially thinner than the height of the bumps comprise the step of creating a substantially planar metal plate.

14. A method for processing an integrated circuit of the type having die bond pads which are connected to the circuit and a thin metal layer thereon, said method comprising the steps of:

coating the circuit with a single layer of photoresist;

creating a first lithographically defined pattern in the photoresist which includes an opening over a plurality of the pads;

plating the exposed circuit portions with a conductive metal to a depth sufficient for creating a bump over each pad suitable for bonding a conductive lead thereto;

creating a second lithographically defined pattern in the photoresist after the step of plating the exposed circuit portions;

etching away that portion of the thin metal layer not covered by photoresist; and dissolving the remaining photoresist.

15. The method of claim 14 wherein the step of creating a second lithographically defined pattern in the photoresist comprises the step of creating a pattern in which a bridge of photoresist connects at least two of the bumps thereby leaving a circuit connection via said thin metal layer after the step of etching away that portion of the thim metal layer not covered by photoresist.

16. The method of claim 14 wherein said integrated circuit further includes a conductive pad formed on said circuit inwardly of said bumps and being in electrical communication with said circuit and the step of creating a second lithographically defined pattern in the photoresist comprises the step of exposing the photoresist to create a pattern which includes a connection between said conductive pad and a bump.

17. The method of claim 14 wherein the steps of creating a second lithographically defined pattern in the photoresist and etching away that portion of the thin metal layer not covered by photoresist comprises the step of defining a substantially planar plate in the thin metal layer.

18. The method of claim 17 wherein said metal further includes the step of mounting a decoupling capacitor on said plate.

19. A method for processing an integrated circuit of the type having a plurality of conductive bumps formed around the periphery thereof and a relatively thin metal film over the remainder of the circuit, said method comprising the steps of:

coating the circuit with a layer of photoresist;

creating a lithographically defined pattern in the photoresist which includes a connection between at least two of the bumps;

dissolving the exposed photoresist;

plating the exposed circuit portions with a conductive metal to a thickness substantially thinner than the height of the bumps thereby creating a substantially planar plate; and mounting a decoupling capacitor in said plate.

20. A method for processing an integrated circuit of the type having a plurality of conductive bumps formed around the periphery thereof, a conductive pad formed on said circuit inwardly of said bumps and being in electrical communication with said circuit and a relatively thin metal film over the remainder of the circuit, said method comprising the steps of:

coating the circuit with a layer of photoresist;

creating a lithographically defined pattern in the photoresist which includes a connection between at least two of the bumps by exposing the photoresist to creat a pattern which includes a connection between said conductive pad and a bump;

dissolving the exposed photoresist; and plating the exposed circuit portions with a conductive metal to a thickness substantially thinner than the height of the bumps.

* * * * *

UNITED STATES PATENT AND TRADEMARK OFFICE
CERTIFICATE OF CORRECTION

PATENT NO. : 5,226,232
DATED : July 13, 1993
INVENTOR(S) : Melissa D. Boyd

It is certified that error appears in the above-indentified patent and that said Letters Patent is hereby corrected as shown below:

Col. 5
    Claim 4, line 53 of the Patent, delete "64"

Col. 6
    Claim 6, line 6 of the Patent, delete "12; line 7, delete "40"; line 9, delete "16"; line 11, delete "16" and "18"; Line 15, delete "47"; line 17, delete "16"; line 23, delete "76"

Claim 7, line 26 of the Patent, delete "12" and "44" and "46"

Claim 8, line 33 of the Patent, delete "76"; line 36, delete "60"

Claim 9, line 39 of the Patent, delete "64"

Claim 10, line 41 of the Patent, delete "40"; line 42, delete "12"; line 43, delete "12"; line 44, delete "82"; line 51, delete "82"; line 52, delete "68"

Col. 7
    Claim 12, line 13 of the Patent, delete "44" and "46"

Signed and Sealed this

Twenty-second Day of March, 1994

Attest:

BRUCE LEHMAN

*Attesting Officer*      *Commissioner of Patents and Trademarks*